(12) United States Patent
Tashiro et al.

(10) Patent No.: US 7,915,720 B2
(45) Date of Patent: Mar. 29, 2011

(54) SEMICONDUCTOR INTEGRATED CIRCUIT DEVICE AND TEST METHOD THEREOF

(75) Inventors: Kazuhiro Tashiro, Kawasaki (JP); Hitoshi Izuru, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 57 days.

(21) Appl. No.: 11/411,877

(22) Filed: Apr. 27, 2006

(65) Prior Publication Data
US 2007/0170425 A1    Jul. 26, 2007

(30) Foreign Application Priority Data

Jan. 6, 2006   (JP) ................................. 2006-001421

(51) Int. Cl.
*H01L 23/02*    (2006.01)
(52) U.S. Cl. .................. 257/678; 257/723; 257/737
(58) Field of Classification Search .............. 257/738, 257/678–733, 737; 438/106
See application file for complete search history.

(56) References Cited

U.S. PATENT DOCUMENTS

| | | | | |
|---|---|---|---|---|
| 5,789,930 | A * | 8/1998 | Isaacs et al. | 324/754 |
| 6,493,240 | B2 * | 12/2002 | Broglia et al. | 361/803 |
| 7,129,584 | B2 * | 10/2006 | Lee | 257/778 |
| 7,129,726 | B2 * | 10/2006 | Tashiro et al. | 324/754 |
| 7,189,593 | B2 * | 3/2007 | Lee | 438/107 |
| 2002/0063317 | A1 | 5/2002 | Hashimoto | |
| 2003/0042587 | A1 * | 3/2003 | Lee | 257/678 |
| 2003/0134450 | A1 * | 7/2003 | Lee | 438/106 |
| 2006/0249827 | A1 * | 11/2006 | Fasano et al. | 257/686 |
| 2006/0249828 | A1 * | 11/2006 | Hong | 257/686 |

FOREIGN PATENT DOCUMENTS

| | | |
|---|---|---|
| JP | 10-242350 | 9/1998 |
| JP | 10-321760 A | 12/1998 |
| JP | 2914308 | 6/1999 |
| JP | 11-191577 A | 7/1999 |
| JP | 2000-88921 A | 3/2000 |
| JP | 2004-241689 A | 8/2004 |
| JP | 2005-353687 A | 12/2005 |

OTHER PUBLICATIONS

Toru Ishida "Advance Substrate and Packaging Technology", 1998 IEMT/IMC Proceedings, pp. 18-24.*
Japanese Office Action dated Jun. 22, 2010, issued in corresponding Japanese Patent Application No. 2006-001421.
Japanese Office Action dated Sep. 28, 2010, issued in corresponding Japanese Patent Application No. 2006-001421. (with partial English translation).

* cited by examiner

*Primary Examiner* — Zandra Smith
*Assistant Examiner* — Telly D Green
(74) *Attorney, Agent, or Firm* — Westerman, Hattori, Daniels & Adrian, LLP

(57) ABSTRACT

The present invention provides a high-quality semiconductor integrated circuit device, where the semiconductor integrated circuit device, a SiP or especially PoP semiconductor integrated circuit device, enables a simultaneous testing of the reliability of multiple upper and lower semiconductor integrated circuit elements; it also enables a testing of only the non-defective element in case the other is determined defective; moreover, only the defective unit is exchangeable with a non-defective unit. The semiconductor integrated circuit device of the present invention contains multiple semiconductor integrated circuit elements, e.g. semiconductor integrated circuit devices 14 and 16, and a circuit board 12 which relays the respective semiconductor integrated circuit elements 14 and 16, and at least a part of the circuit board 12, e.g. test pads 13, can be electrically connected to an external test apparatus when the semiconductor integrated circuit devices 14 and 16 are electrically connected to the circuit board 12.

18 Claims, 8 Drawing Sheets

SEMICONDUCTOR INTEGRATED CIRCUIT DEVICE AND TEST METHOD THEREOF

CROSS-REFERENCE TO RELATED APPLICATIONS

This application is based upon and claims the benefits of the priority from the prior Japanese Patent Application No. 2006-001421, filed on Jan. 6, 2006, the entire contents of which are incorporated herein by reference.

BACKGROUND OF THE INVENTION

1. Field of the Invention

The present invention relates to a semiconductor integrated circuit device and an efficient test method of the semiconductor integrated circuit device, where the semiconductor integrated circuit device, a SiP or especially PoP semiconductor integrated circuit device, enables a simultaneous testing of the reliability of multiple upper and lower semiconductor integrated circuit elements as well as an exchange only of a defective element for a non-defective unit in case any of the elements is defective; and similarly it enables an exchange of a defective element which occurs during a screening process such as burn-in.

2. Description of the Related Art

Recent development of mobile-phones, digital still cameras, digital video cameras, laptops and Personal Digital Assistants (PDA) demands smaller and lighter semiconductor integrated circuit devices, and the use of System in Package (SiP) that one external packaging is composed of multiple semiconductor integrated circuit devices has been growing. Among this SiP, the use of a Package on Package (PoP) has been increasing that one external packaging is composed by mounting at the back of a semiconductor integrated circuit device another semiconductor integrated circuit device.

It is required in the PoP that the upper semiconductor integrated circuit device and the lower semiconductor integrated circuit device should be tested simultaneously, but the simultaneous testing of multiple the upper and lower semiconductor integrated circuit devices is quite difficult because of the following reasons. A test of a PoP as a whole is conducted at terminals output at the undersurface of the lower semiconductor integrated circuit device; there are many cases that not all the terminals of the upper semiconductor integrated circuit device are output to the lower terminals since multiple semiconductor integrated circuit devices together composes a system LSI. Also, when the test detects a defect in any one of the upper and lower semiconductor integrated circuit devices, the both devices must be treated as a defect even though the other semiconductor integrated circuit device is non-defective. This is because the upper and lower semiconductor integrated circuit devices are not easily separated. As a result, the yield of the measuring test degrades exponentially. That is, when each of the upper and lower semiconductor integrated circuit devices has 90% of non-defectives, for example, the yield of the test is 90%×90%=81%. Similarly for the screening process such as burn-in, when any one of the upper and lower semiconductor integrated circuit devices is determined defective during the screening process, the both upper and lower semiconductor integrated circuit devices are treated as a defective since they cannot be easily separated as mentioned above. As a result, there is a problem that the yield of the screening process degrades exponentially.

Japanese Patent (JP-B) No. 2914308 proposes a test method of a semiconductor device that an interposer having a through-hole interposes between a semiconductor device and a test board to simplify the alignment of an electrode in the semiconductor device and a bump in the test board, and Japanese Patent Application Laid-Open (JP-A) No. 10-242350 proposes a mount structure of a bare chip that the bare chip is mounted on a circuit board through an interposer and that the bare chip may be easily removed in case the bare chip is defective. None of these, however, discloses an application to a SiP semiconductor integrated circuit device having multiple semiconductor integrated circuit devices. Regarding especially a PoP semiconductor integrated circuit device, a semiconductor integrated circuit device in which the both upper and lower semiconductor integrated circuit devices may be simultaneously tested and only a defect is exchangeable with a non-defect and an efficient test method of the semiconductor integrated circuit device have not yet been proposed.

The present invention resolves the existing problems mentioned above and aims at achieving the following objects. That is, the present invention provides a high-quality semiconductor integrated circuit device and an efficient test method of the semiconductor integrated circuit device, where the semiconductor integrated circuit device, a SiP or especially PoP semiconductor integrated circuit device, enables a simultaneous testing of the reliability of multiple upper and lower semiconductor integrated circuit elements; it also enables a testing of only the non-defective element in case the other is determined defective; moreover, only the defective unit is exchangeable with a non-defective unit; similarly when one becomes defective during a screening process such as burn-in, the process can be continued without regarding the other as defective.

SUMMARY OF THE INVENTION

A semiconductor integrated circuit device of the present invention includes multiple semiconductor integrated circuit elements and a circuit board which relays each of the semiconductor integrated circuit elements, and at the state where each of the semiconductor integrated circuit elements is electrically connected through the circuit board, at least a part of the circuit board can be electrically connected to an external test apparatus.

In the semiconductor integrated circuit device, multiple semiconductor integrated circuit elements are electrically connected through the circuit board; therefore, the semiconductor integrated circuit elements may be simultaneously tested and screened. Also, since at least a part of the circuit board may be electrically connected to the external test apparatus, the upper semiconductor integrated circuit elements located on the upper side of the circuit board, for example, may be separately tested or screened. In addition, only a defective unit may be removed and exchanged for a non-defective unit. Hence, the semiconductor integrated circuit device of the present invention is high quality, and it is particularly suitable for a SiP and especially PoP semiconductor integrated circuit devices.

The test method of a semiconductor integrated circuit device of the present invention is a method for testing the semiconductor integrated circuit device of the present invention, and the semiconductor integrated circuit elements located at least on one side of the circuit board is tested by means of an external test apparatus.

In the test method of a semiconductor integrated circuit device, a test such as reliability test is conducted on semiconductor integrated circuit elements located at least on one side, the upper side for example, of the circuit board. Since only a defective unit may be removed and exchanged for a non-defective unit, non-defective units may be combined and mounted again. Therefore, the semiconductor integrated circuit device as a whole seldom becomes unavailable even though any one of the semiconductor integrated circuit elements is defective, and the decrease in the yield of an individual non-defective semiconductor integrated circuit element may be prevented.

In addition, in a test with the external test apparatus, a screening process such as burn-in is performed by applying a screening pattern to the semiconductor integrated circuit element. Even though any one among multiple semiconductor integrated circuit elements breaks down, the screening process may be continued for the non-defective semiconductor integrated circuit element without regarding the whole semiconductor integrated circuit device as defective. Therefore, the decrease in the yield of an individual non-defective semiconductor integrated circuit element may be prevented.

DESCRIPTION OF THE PREFERRED EMBODIMENTS

The semiconductor integrated circuit device and the test method thereof of the present invention will be illustrated in more detail with reference to examples given below, but these are not to be construed as limiting the present invention.

Example 1

Figure 1A:
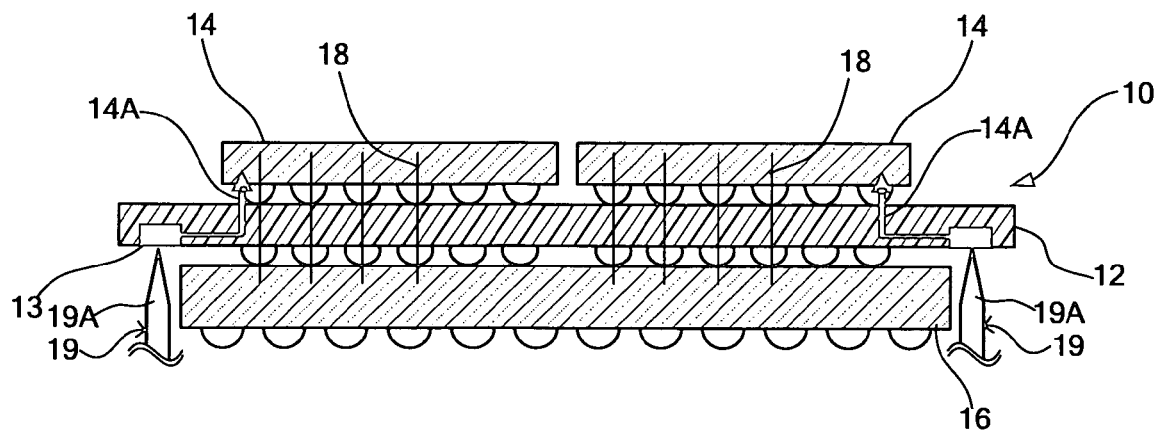
FIG. 1A is a vertical cross-sectional diagram showing the first example, i.e. Example 1, of a semiconductor integrated circuit device of the present invention.
Figure 1B:
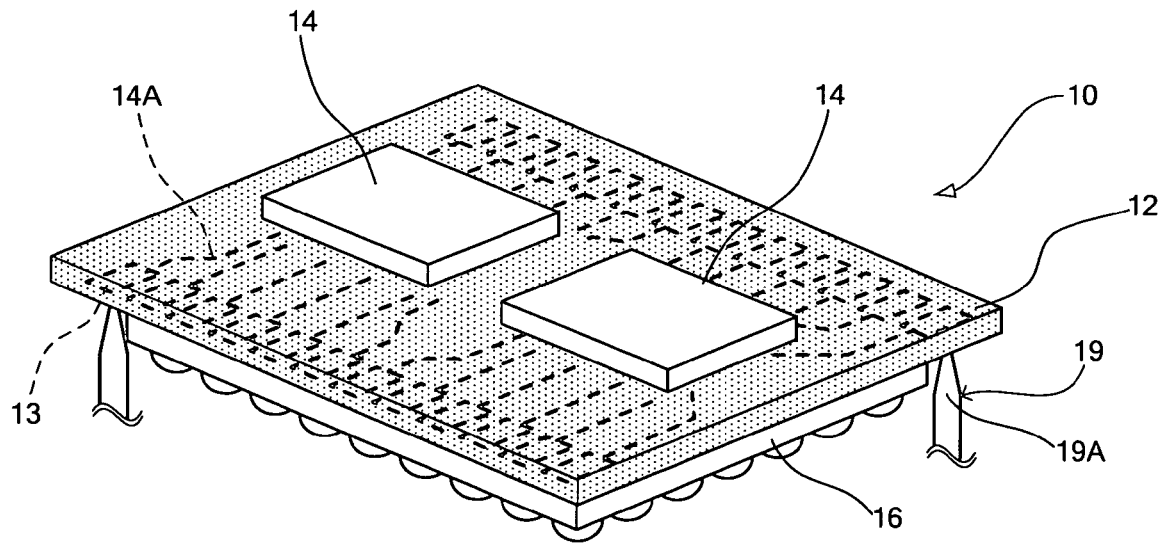
FIG. 1B is a perspective view showing the first example, i.e. Example 1, of a semiconductor integrated circuit device of the present invention.

The first example of a semiconductor integrated circuit device of the present invention is illustrated in FIGS. 1A and 1B. FIG. 1B is the perspective view of the semiconductor integrated circuit device shown in FIG. 1A.

Regarding a PoP semiconductor integrated circuit device that an external packaging is formed by laminating and mounting multiple semiconductor integrated circuit devices, i.e. the semiconductor integrated circuit elements, a semiconductor integrated circuit device 10 shown in FIG. 1A has two upper semiconductor integrated circuit devices 14 and one lower semiconductor integrated circuit device 16, for example, which are packaged through the circuit board 12 such as printed board and ceramic board. The circuit board 12 has connecting terminals located opposite to connecting terminals on the back side of the lower semiconductor integrated circuit device 16 and connecting terminals located opposite to output terminals on the upper semiconductor integrated circuit devices 14. These are connected and fixed to a mounting means such as soldering to form an external packaging. Also, the upper semiconductor integrated circuit devices 14 and the lower semiconductor integrated circuit device 16 are electrically connected to wirings 18.

As shown in FIG. 1B, multiple test pads 13 are allocated at the periphery of the circuit board 12, and the test pads 13 are connected to circuit patterns 14A for the upper semiconductor integrated circuit devices 14.

When each of the test pad 13 is contacted with a contactor 19A of a test contactor 19 and furthermore the wiring of the test contactor 19 is connected to an external test apparatus (not shown), the upper semiconductor integrated circuit devices 14 and the lower semiconductor integrated circuit device 16 which are electrically connected through the circuit board 12 to the wiring 18 may be simultaneously tested for reliability and screened. Also, the upper semiconductor integrated circuit devices 14 in the semiconductor integrated circuit device 10 may be independently tested for reliability and screened since each test pad 13 is connected to the circuit pattern 14A for upper semiconductor integrated circuit devices 14.

In Example 1, the number of the upper semiconductor integrated circuit device 14 is two, and the number of the lower semiconductor integrated circuit device 16 is one. However, the number and the type of these semiconductor integrated circuit devices are not particularly restricted and can be appropriately selected according to applications. Also, in Example 1, the upper semiconductor integrated circuit devices 14 may be mutually identical or different. Examples of the upper semiconductor integrated circuit devices 14 include a combination of a flash memory and a DRAM, and examples of the lower semiconductor integrated circuit device 16 include a logic.

Also in Example 1, the number of the circuit board 12 is one, but the number of the circuit board 12 is not particularly restricted and can be appropriately selected according to applications. The circuit board 12 is not particularly restricted as long as it relays semiconductor integrated circuit devices and has a function to connect electrically these semiconductor integrated circuit devices, and it may be appropriately selected according to applications.

Example 2

Figure 2:
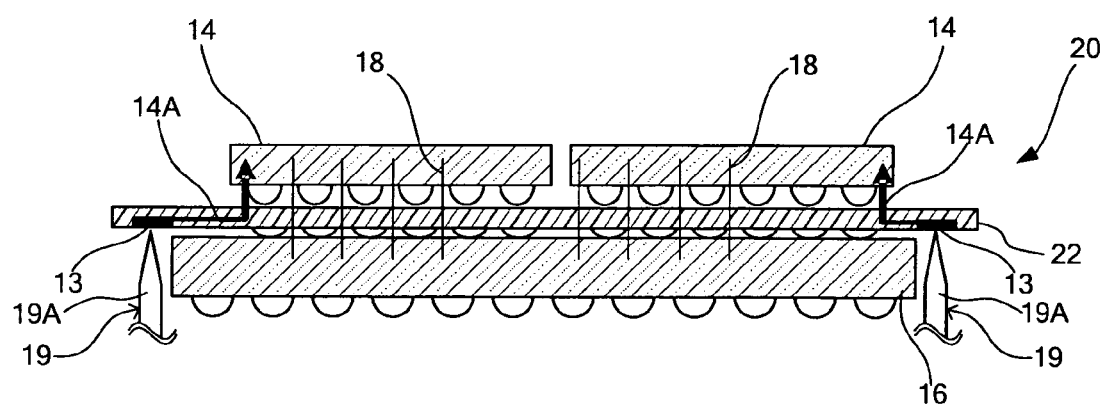
FIG. 2 is a vertical cross-sectional schematic diagram showing the second example, i.e. Example 2, of a semiconductor integrated circuit device of the present invention.

The second example of the semiconductor integrated circuit device of the present invention is illustrated in FIG. 2.

A semiconductor integrated circuit device 20 shown in FIG. 2 has a flexible circuit board 22 in place of the circuit board 12 in the semiconductor integrated circuit device 10 of Example 1. Therefore, the connection status is stably maintained without peeling or cracking in the mounted devices owing to the properties of the flexible circuit board 22 such as pliability and flexibility even if the misalignment of the upper and lower semiconductor integrated circuit devices 14 and 16 in mounting or due to expansion caused by temperature change. Also, the flexible circuit board 22 is in the form of a thin sheet, and it can decrease the mounting height of the semiconductor integrated circuit devices 14 and 16. Therefore, the total height of the semiconductor integrated circuit device 20 may be suppressed.

Example 3

Figure 3:
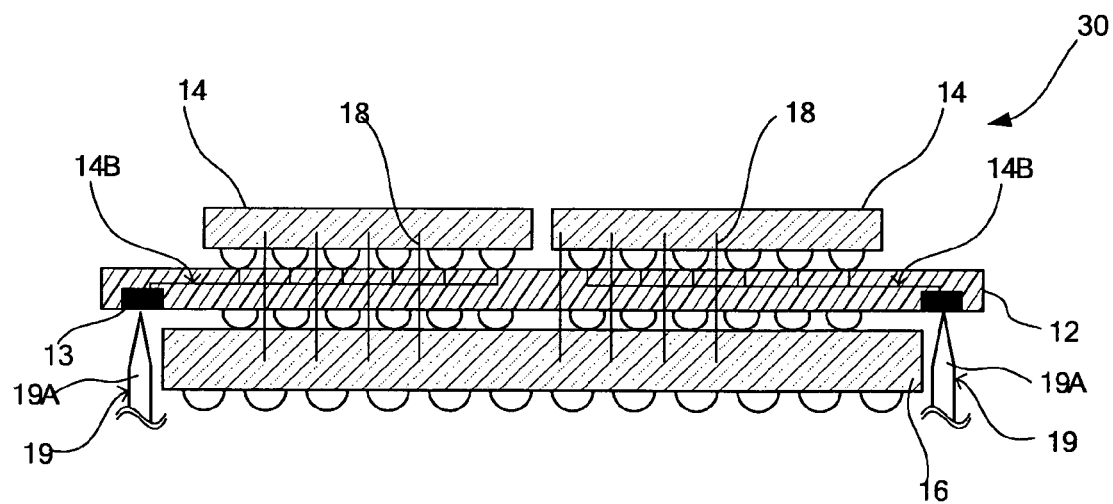
FIG. 3 is a vertical cross-sectional schematic diagram showing the third example, i.e. Example 3, of a semiconductor integrated circuit device of the present invention.

The third example of the semiconductor integrated circuit device of the present invention is illustrated in FIG. 3.

A semiconductor integrated circuit device 30 shown in FIG. 3 has a wiring 14B drawn from each of multiple terminals in the upper semiconductor integrated circuit device 14 in the semiconductor integrated circuit device 10 in Example 1 is electrically connected to the test pad 13. In Example 3, the wirings 14B drawn from the terminals of the upper semiconductor integrated circuit devices 14 which are not output to the undersurface of the lower semiconductor integrated circuit device 16 ensures an execution of the reliability test of the upper semiconductor integrated circuit devices 14.

Example 4

The fourth example of the semiconductor integrated circuit device of the present invention is illustrated in FIG. 4.

Figure 4A:
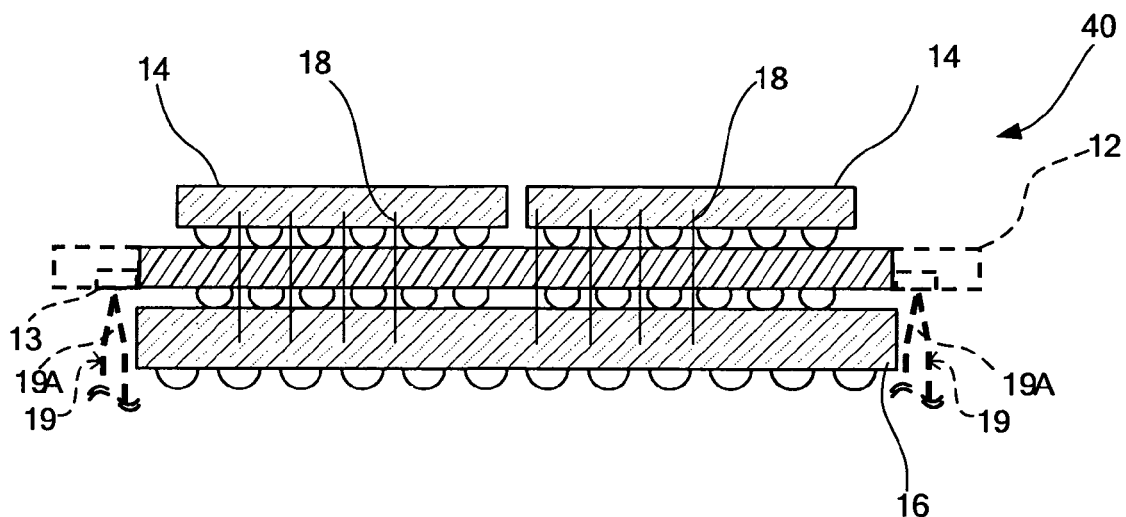
FIG. 4A is a vertical cross-sectional schematic diagram showing the fourth example, i.e. Example 4, of a semiconductor integrated circuit device of the present invention.

A semiconductor integrated circuit device 40 shown in FIG. 4A may be obtained from the semiconductor integrated circuit device 10 in Example 1 by cutting off the periphery including the test pads 13 and a part of the wiring pattern 14A drawn from the circuit board 12 in the circuit board 12 after the completion of the reliability test.

Figure 4B:
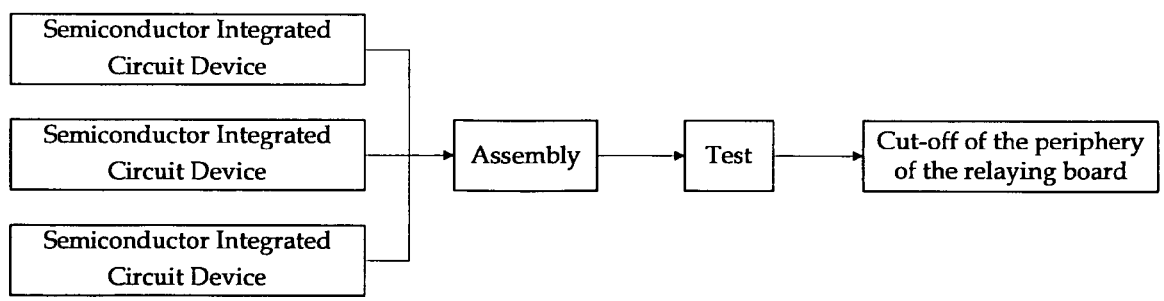
FIG. 4B is a process flow diagram illustrating the manufacturing process of a semiconductor integrated circuit device of the fourth example, i.e. Example 4, of the present invention.

FIG. 4B shows a process flow diagram for manufacturing the semiconductor integrated circuit device 40. As shown in FIG. 4B, first of all, multiple semiconductor integrated circuit devices are assembled through a circuit board, and the semiconductor integrated circuit device 10 of Example 1 shown in FIG. 1A is manufactured. Next, a reliability test is conducted on the semiconductor integrated circuit device 10. Then, the periphery including the test pads 13 and a part of the circuit pattern 14A drawn from the circuit board 12 are cut off, and finally the semiconductor integrated circuit device 40 of Example 4 shown in FIG. 4A can be produced.

As described above, by cutting off the test pads 13 and a part of the circuit pattern 14A after testing, the external shape of the semiconductor integrated circuit device 40 may be further reduced in size.

Example 5

Figure 5A:
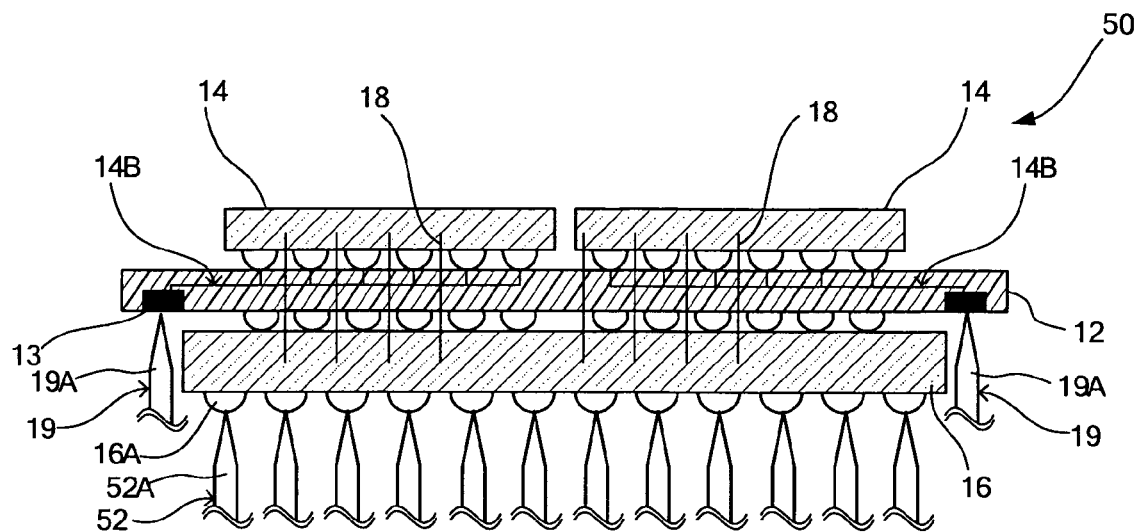
FIG. 5A is a vertical cross-sectional schematic diagram showing the fifth example, i.e. Example 5, of a semiconductor integrated circuit device of the present invention.

The fifth example of the semiconductor integrated circuit device of the present invention is illustrated in FIG. 5A.

A semiconductor integrated circuit device 50 shown in FIG. 5A is equivalent to the semiconductor integrated circuit device 30 of Example 3 which further includes contactors 52A of lower-side test contactors 52 contacting with mounting terminals 16A on the lower semiconductor integrated circuit device 16 and wiring for the lower-side test contactors 52 connected to an external test apparatus (not shown). Each of the upper semiconductor integrated circuit devices 14 connected to the upper-side test contactors 19 and the semiconductor integrated circuit device 16 connected to the lower-side test contactors 52 may be tested in parallel.

Figure 5B:
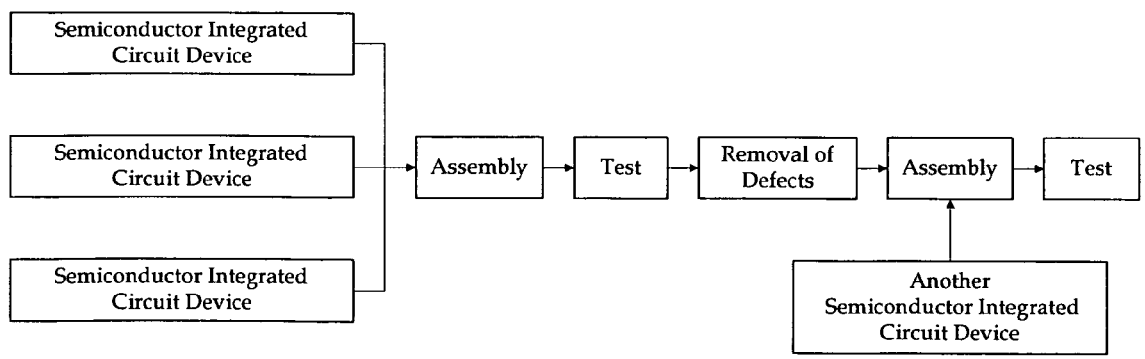
FIG. 5B is a process flow diagram illustrating the process flow of a reliability test for a semiconductor integrated circuit device of the fifth example, i.e. Example 5, of the present invention.

FIG. 5B shows a process flow diagram of a reliability test for the semiconductor integrated circuit device 50. As shown in FIG. 5B, first of all, multiple semiconductor integrated circuit devices are assembled through a circuit board 12, and the semiconductor integrated circuit device 50 of Example 5 shown in FIG. 5A is manufactured. Next, a reliability test is conducted on each of the upper semiconductor integrated circuit devices 14 and the lower semiconductor integrated circuit device 16, and each is decided as 'good' or 'no-good.' The status, 'good' or 'no-good,' may be determined by whether or not an expected waveform is output on the monitor terminal provided for each semiconductor integrated circuit device. As a result, when a defective semiconductor integrated circuit device is found and determined as 'no-good,' the defective unit is removed from the circuit board 12 and exchanged for another semiconductor integrated circuit device, which is connected and mounted again. The reliability test is conducted again in the same manner, and the operations are repeated until a combination of non-defective units is achieved.

As described above, in Example 5, reliability tests may be conducted independently and in parallel for the upper semiconductor integrated circuit devices 14 and the lower semiconductor integrated circuit device 16, and non-defective units may be combined and assembled. Therefore, a semiconductor integrated circuit device as a whole does not becomes unavailable even though any one of the semiconductor integrated circuit elements is defective, and the exponential decrease in the yield of an individual non-defective semiconductor integrated circuit device may be prevented.

Example 6

Figure 6:
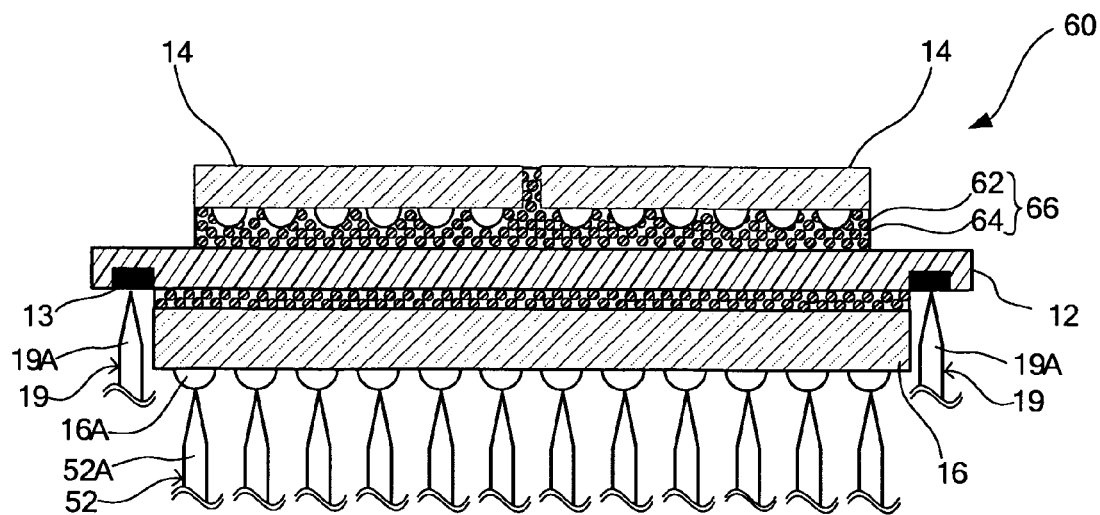
FIG. 6 is a vertical cross-sectional schematic diagram showing the sixth example, i.e. Example 6, of a semiconductor integrated circuit device of the present invention.

The sixth example of the semiconductor integrated circuit device of the present invention is illustrated in FIG. 6.

A semiconductor integrated circuit device 60 shown in FIG. 6 is equivalent to the semiconductor integrated circuit device 50 of Example 5 in which anisotropic conductive members 66 including copper as a conductive material 62 and a thermoplastic plastic as an anisotropic conductive resin 64 arranged between the circuit board 12 and the upper semiconductor integrated circuit devices 14 and between the circuit board 12 and the lower semiconductor integrated circuit device 16, and the upper semiconductor integrated circuit devices 14, the circuit board 12 and the lower semiconductor integrated circuit device 16 are electrically connected via the anisotropic conductive members 66. When a defective semiconductor integrated circuit device is found in a reliability test, the anisotropic conductive member 66 to which the defective unit is contacted is heated again. Then, the anisotropic conductive resin 64 plasticizes and becomes brittle. Therefore, only the defective unit may be removed for exchange, and another semiconductor integrated circuit device may be easily mounted again.

The conductive material 62 is not particularly restricted as long as it has conductivity, and it can be appropriately selected according to applications. Examples other than copper include nickel, gold, silver and iron. Also, the anisotropic conductive resin 64 is not particularly restricted and can be appropriately selected according to applications. It preferably has plasticity, and examples of the plastic material include a polyethylene resin, a polypropylene resin, a vinyl chloride resin, a styrene resin and a methacrylate resin.

Example 7

Figure 7:
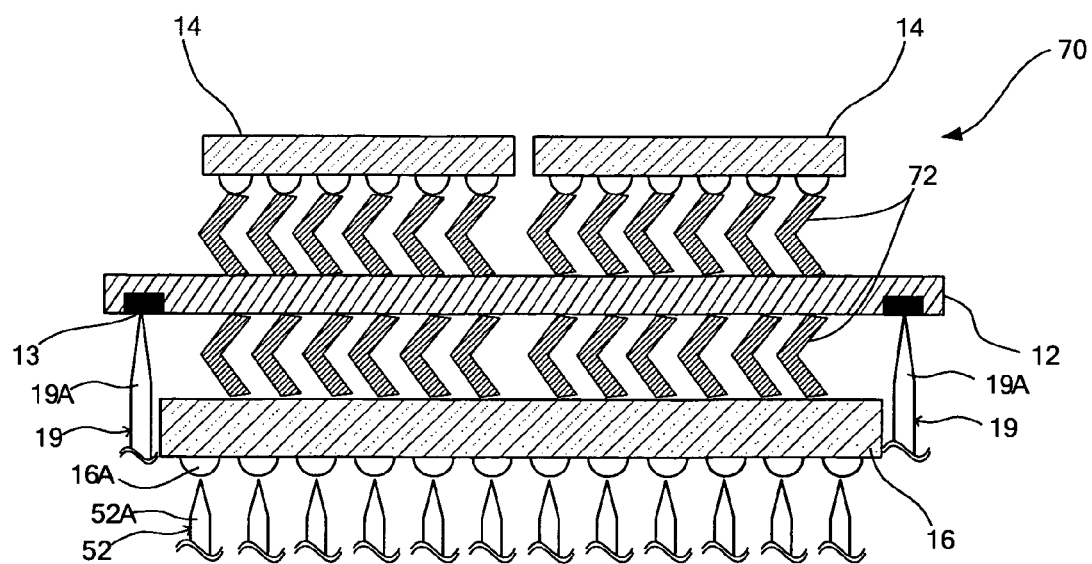
FIG. 7 is a vertical cross-sectional schematic diagram showing the seventh example, i.e. Example 7, of a semiconductor integrated circuit device of the present invention.

The seventh example of the semiconductor integrated circuit device of the present invention is illustrated in FIG. 7.

A semiconductor integrated circuit device 70 shown in FIG. 7 is equivalent to the semiconductor integrated circuit device 50 of Example 5 in which dog-leg contactors 72 of mechanical spring members are arranged in parallel between the circuit board 12 and the upper semiconductor integrated circuit devices 14 and between the circuit board 12 and the lower semiconductor integrated circuit device 16, and the upper semiconductor integrated circuit devices 14, the circuit board 12 and the lower semiconductor integrated circuit device 16 are electrically connected via the contactors 72. When a defective semiconductor integrated circuit device is found in a reliability test, the contactors 72 to which the defective device is contacted are removed. Then, only the defective unit may be removed for exchange, and another semiconductor integrated circuit device may be easily mounted again.

The contactor 72 is not particularly restricted in terms of its shape, structure and material, and it can be appropriately selected according to applications. Examples thereof include a metallic pin-shaped contactor.

Example 8

Figure 8:
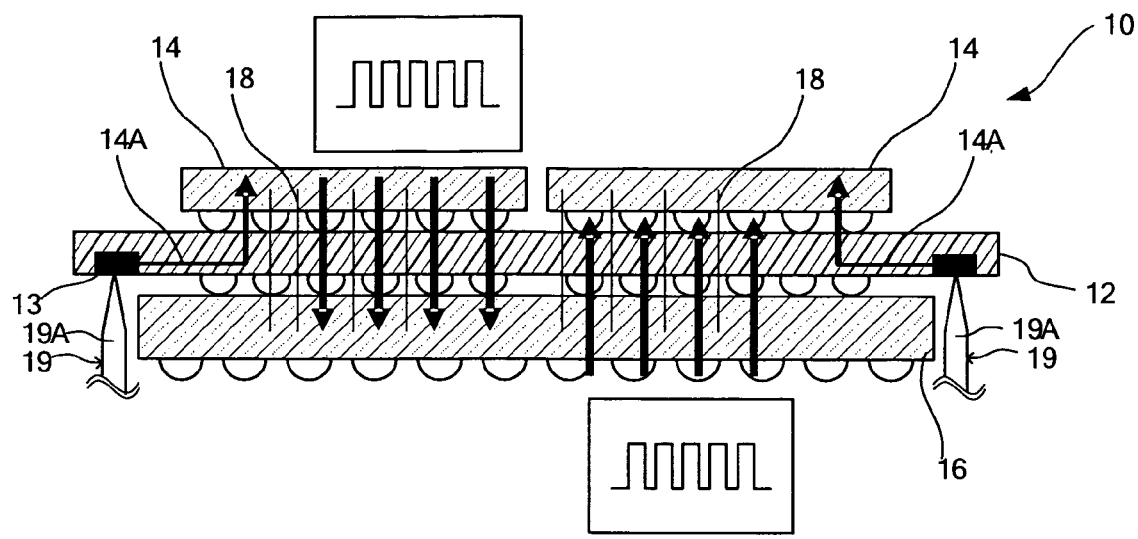
FIG. 8 is a schematic diagram illustrating one example of a screening process by means of a semiconductor integrated circuit device of the present invention.

The eighth example is illustrated in FIG. 8 as an example of a screening process by means of a semiconductor integrated circuit device of the present invention.

For example, the semiconductor integrated circuit device 10 of Example 1 undergoes a screening process such as burn with an application of a screening pattern from a screening applying means (not shown). Here, as shown in FIG. 8, the upper semiconductor integrated circuit devices 14 and the lower semiconductor integrated circuit device 16 generate screening patterns of the semiconductor integrated circuit devices 16 and 14 facing across the circuit board 12, respectively. Even though an upper semiconductor integrated circuit device breaks down, for example, a screening pattern may be applied only to the lower semiconductor integrated circuit device 16 from the external test apparatus. Therefore, the screening process may be continued.

The screening process may be conducted in the same manner on the semiconductor integrated circuit devices of Examples 2 to 7.

Example 9

Figure 9:
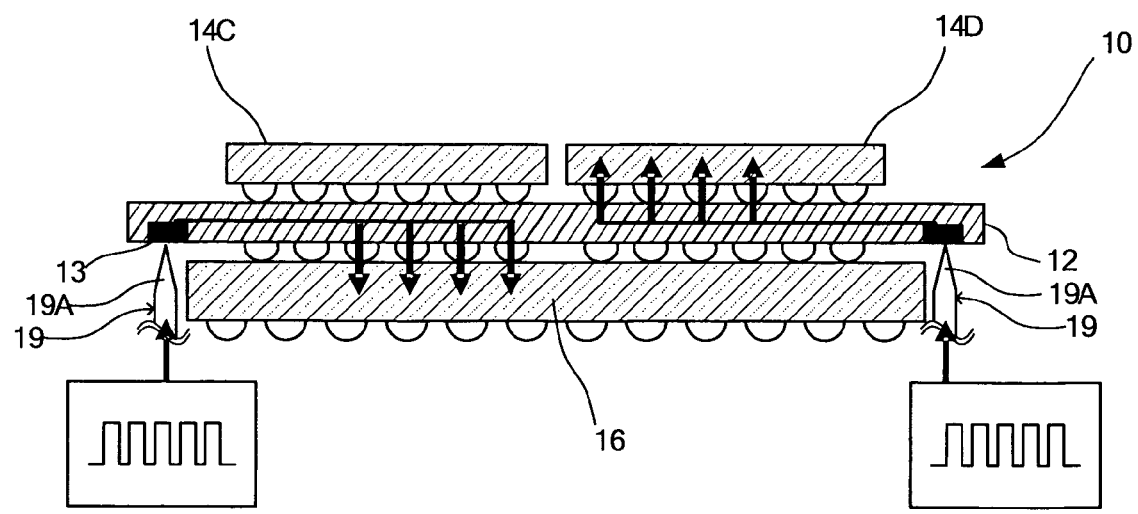
FIG. 9 is a schematic diagram illustrating another example of a screening process by means of a semiconductor integrated circuit device of the present invention.

The ninth example is illustrated in FIG. 9 as another example of a screening process by means of a semiconductor integrated circuit device of the present invention.

For example, the semiconductor integrated circuit device 10 of Example 1 undergoes a screening process such as burn-in with an application of a screening pattern from a screening applying means (not shown). When any of the upper semiconductor integrated circuit devices 14 and the lower semiconductor integrated circuit device 16 breaks down during screening, a screening pattern is applied externally through the test pads 13 in the circuit board 12 as shown in FIG. 9. Among the two upper semiconductor integrated circuit devices 14 in the semiconductor integrated circuit device 10 shown in FIG. 9, the semiconductor integrated circuit device 14C located on the left side breaks down, for example. Then, a screening pattern is applied through the test pads 13 in the circuit board 12, and the screening pattern is applied to each of the non-defective lower semiconductor integrated circuit device 16 and the non-defective right-side semiconductor integrated circuit device 14D of the two upper semiconductor integrated circuit devices. Thus, the screening process may be continued in this way for the non-defective semiconductor integrated circuit devices.

The screening process may be conducted in the same manner on the semiconductor integrated circuit devices of Examples 2 to 7.

Figure 10:
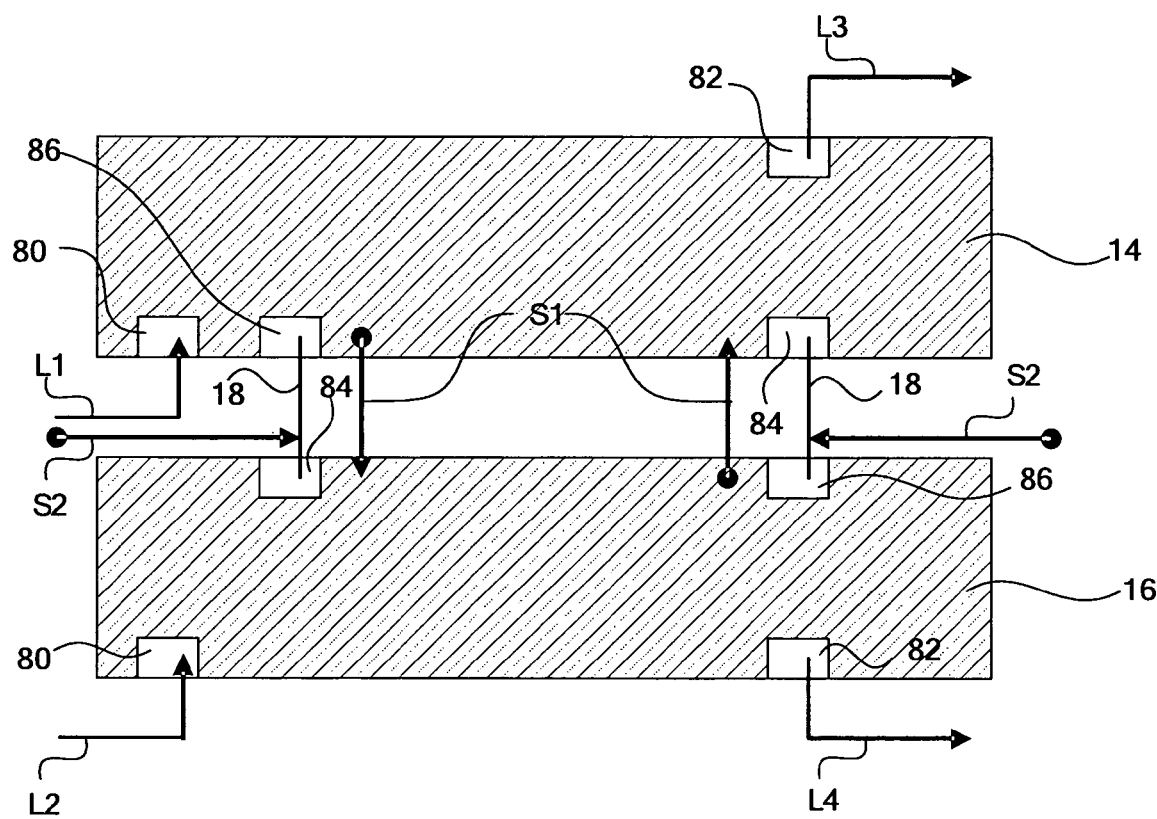
FIG. 10 is a schematic diagram illustrating one example of a circuit connection in screening processes of the eighth and ninth examples, i.e. Examples 8 and 9.

Next, an example of a circuit connection in the screening processes of Examples 8 and 9 is shown in FIG. 10.

As shown in FIG. 10, each of an upper semiconductor integrated circuit device 14 and the lower semiconductor integrated circuit device 16 has a test mode terminal 80 i.e. input terminal, and a monitor terminal 82 to enable a screening in a PoP semiconductor integrated circuit device. The receiving side has an input terminal 84, and the sending side has an input-output terminal 86 in order to send and receive opposing screening patterns.

In FIG. 10, a wiring L1 is electrically connected from an external test apparatus through the circuit board; a wiring L2 is electrically connected from an external test apparatus through the contactors 52A (in FIG. 5A) of the lower-side test contactors 52 (in FIG. 5A); a wiring L3 is drawn to the wiring board 12 (in FIGS. 8 and 9) and electrically connected, and it is eventually connected to an external test apparatus; a wiring L4 is drawn through the contactors 52A of the lower-side test contactors 52, and it is eventually connected to an external test apparatus.

In the screening process of Example 8 shown in FIG. 8, an external test apparatus (not shown) sends a signal of action initiation instruction to the test mode terminals 80 so that the semiconductor integrated circuit devices 14 and 16 generate screening patterns S1 with respect to each other. In other words, a test mode terminal 80 plays a role as a control terminal to generate an opposing screening pattern S1. Upon receiving the action initiation instruction, it generates a screening pattern S1 to perform a screening process.

In the screening process of Example 9 shown in FIG. 9, it is first of all necessary for the external test apparatus to recognize that any of the semiconductor integrated circuit devices 14 and 16 has become defective, and this is achieved by monitor terminals 82 allocated on each of the semiconductor integrated circuit devices 14 and 16. The monitor terminals are configured such that a specific expected value is output on the terminals while the semiconductor integrated circuit devices 14 and 16 are operating normally, and the monitor terminals 82 are constantly observed during the screening process to confirm whether or not the devices are operating normally. When a waveform other than the expected value is output on the monitor terminals 82, the external test apparatus immediately sends the semiconductor integrated circuit device which has output the waveform other than the expected value an action termination instruction to the test mode terminal 80. Also, at the same time as the transmission of the instruction to terminate action to the test mode terminal 80, a circuit which transforms the input-output terminal 86 from an input state to a high-impedance state is formed in advance so that the superfluous waveforms from the defective semiconductor integrated circuit device is not applied to the opposing semiconductor integrated circuit device.

In Example 9, the screening pattern S2 may be applied from the external test apparatus through the test pads 13 (in FIG. 9) to the wiring 18 which is electrically connected beforehand to the upper and lower semiconductor integrated circuit devices to continue the screening process to the semiconductor integrated circuit device which can no longer receive the screening pattern. Therefore, upon recognizing the failure on the monitor terminal 82, the external test apparatus sends an action termination instruction to the test mode terminal 80 as well as applies an input waveform equivalent to the screening pattern S2 through the test pads 13 so that the screening process is continued.

Conventional Example

Figure 11:
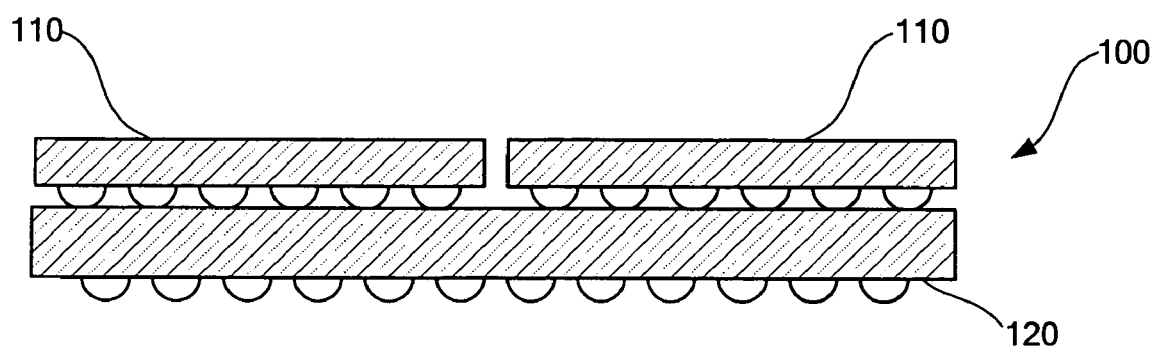
FIG. 11 is a vertical cross-sectional schematic diagram showing a conventional semiconductor integrated circuit device.

FIG. 11 shows an example of a conventional Package on Package (PoP) semiconductor integrated circuit device.

A semiconductor integrated circuit device 100 shown in FIG. 11 is a PoP semiconductor integrated circuit device which forms one external packaging by laminating and mounting multiple semiconductor integrated circuit devices; it includes two upper semiconductor integrated circuit devices 110 and one lower semiconductor integrated circuit device 120, forming one external packaging by connecting and fixing terminals on the upper semiconductor integrated circuit devices 110 to connecting terminals located on the back surface of the lower semiconductor integrated circuit device 120 by means of a mounting means such as soldering.

When a reliability test is conducted on a conventional semiconductor integrated circuit device having such configuration, and any one of the upper and lower semiconductor integrated circuit devices 110 and 120 is defective, the both upper and lower semiconductor integrated circuit devices must be treated as defective even though the other is non-defective. This is because the upper and lower semiconductor integrated circuit devices 110 and 120 cannot be easily removed. Therefore, the yield in the reliability test decreases exponentially. Similarly, when a screening process such as burn-in is performed, and any of the upper and lower semiconductor integrated circuit devices 110 and 120 breaks down and becomes defective during the screening process, the both must be treated as defective since it is not possible to remove only the defective unit. Therefore, the screening process cannot be continued.

The present invention resolves the existing problems mentioned above and can provide a high-quality semiconductor integrated circuit device and an efficient test method of the semiconductor integrated circuit device, where the semiconductor integrated circuit device, a SiP or especially PoP semiconductor integrated circuit device, enables a simultaneous testing of the reliability of multiple upper and lower semiconductor integrated circuit devices; it also enables a testing of only the non-defective in case the other is determined defective; moreover, only the defective is exchangeable with non-defective; similarly when one becomes defective during a screening process such as burn-in, the process can be continued without regarding the other as a defective.

The semiconductor integrated circuit device of the present invention, a SiP or especially PoP semiconductor integrated circuit device, enables a simultaneous testing of the reliability of multiple upper and lower semiconductor integrated circuit devices; it also enables a testing of only a non-defective unit in case the other is determined as defective; moreover, only the defective unit is exchangeable for a non-defective unit; similarly when one becomes defective during a screening process such as burn-in, the process can be continued without regarding the other as defective; and it is high quality.

The method for testing a semiconductor integrated circuit device of the present invention can continue processing during a reliability test and a screening process even though a defective unit exists among multiple semiconductor integrated circuit devices and allows a removal of only the defective unit and exchange for a non-defective unit. Therefore, the reduction of yield in the test and process may be prevented.

What is claimed is:

1. A semiconductor integrated circuit device comprising:
a circuit board;
a plurality of first semiconductor integrated circuit elements configured side by side in a horizontal position on a first surface of the circuit board; and
a second semiconductor integrated circuit element provided on a second surface of the circuit board being opposite to the first surface, the second semiconductor integrated circuit element electrically coupled to the plurality of first semiconductor integrated circuit elements through the circuit board;
wherein, at least a part of the circuit board is electrically couplable to an external test apparatus, and the second semiconductor integrated circuit element includes a terminal provided directly on a surface opposite to a surface facing the circuit board.

2. The semiconductor integrated circuit device according to claim 1,
wherein, test pads are arranged on at least a part of the circuit board and coupled a circuit pattern in any of the semiconductor integrated circuit elements; and
the test pads are contacted with a test contactor, and the semiconductor integrated circuit device is electrically coupled to the external test apparatus through the test contactor.

3. The semiconductor integrated circuit device according to claim 1, wherein the circuit board is a flexible board.

4. The semiconductor integrated circuit device according to claim 2,
wherein, among the semiconductor integrated circuit elements which are electrically coupled to one another through the circuit board only a semiconductor integrated circuit element located on one side of the circuit board is tested by means of the external test apparatus.

5. The semiconductor integrated circuit device according to claim 4,
wherein, in parallel with the test of a semiconductor integrated circuit element located on one side of the circuit board, a semiconductor integrated circuit elements located on the other side of the circuit board is tested by means of an external test apparatus.

6. The semiconductor integrated circuit device according to claim 1,
wherein, at least one of the plurality of first semiconductor integrated circuit element and the second semiconductor integrated circuit element is removable.

7. The semiconductor integrated circuit device according to claim 4,
wherein, at least a part of the circuit board is cut off after the test by means of the external test apparatus; and
the circuit pattern and the test pads which are leading to the circuit board are removed.

8. The semiconductor integrated circuit device according to claim 1, wherein, the part of the circuit board is the periphery of the circuit board.

9. The semiconductor integrated circuit device according to claim 1,
wherein, the plurality of first and the second semiconductor integrated circuit elements and the circuit board are electrically coupled by means of an anisotropic conductive material.

10. The semiconductor integrated circuit device according to claim 9, wherein, the anisotropic conductive material comprises a resin having plasticity.

11. The semiconductor integrated circuit device according to claim 10, wherein, the resin having plasticity is a plastic.

12. The semiconductor integrated circuit device according to claim 1,
wherein, the plurality of first and the second semiconductor integrated circuit elements and the circuit board are electrically coupled by means of contactors.

13. The semiconductor integrated circuit device according to claim 1,
wherein, each of the semiconductor integrated circuit element generates a screening pattern of its opposing semiconductor integrated circuit element,
wherein, the semiconductor integrated circuit element and its opposing semiconductor integrated circuit element are facing with each other across the circuit board.

14. The semiconductor integrated circuit device according to claim 1, wherein, a screening pattern is externally applied to the circuit board.

15. A method for testing a semiconductor integrated circuit device comprising a step of testing a semiconductor integrated circuit device,
wherein, the semiconductor integrated circuit device comprises a circuit board, a plurality of first semiconductor integrated circuit elements configured side by side in a horizontal position on a first surface of the circuit board, a second semiconductor integrated circuit element provided on a second surface of the circuit board being opposite to the first surface, and a terminal provided directly on a surface of the second semiconductor integrated circuit element, the surface being opposite to a surface facing the circuit board, the second semiconductor integrated circuit element electrically coupled to the first semiconductor integrated circuit element through the circuit board;
at least a part of the circuit board is electrically couplable to an external test apparatus when the plurality of first semiconductor integrated circuit elements and the second semiconductor integrated circuit element are electrically coupled through the circuit board; and
wherein the method tests at least one of the plurality of first and second semiconductor integrated circuit elements by means of the external test apparatus through the terminal and the part of the circuit board.

16. The method for testing a semiconductor integrated circuit device according to claim 15,
wherein, in parallel with the test of one of the plurality of first semiconductor integrated circuit elements, the second semiconductor integrated circuit element, and the plurality of first and the second semiconductor integrated circuit elements are removed and exchanged according to the results of these tests.

17. The method for testing a semiconductor integrated circuit device according to claim 15,
wherein, at least a part of the circuit board is cut off to remove the circuit pattern and the test pads leading to the circuit board after the test with the external test apparatus.

18. The method for testing a semiconductor integrated circuit device according to claim 15,
wherein, a screening pattern is applied to at least one of the plurality of first and the second semiconductor integrated circuit element during the testing by means of the external test apparatus.

* * * * *